(12) United States Patent
Sung et al.

(10) Patent No.: US 11,527,677 B2
(45) Date of Patent: Dec. 13, 2022

(54) SEMICONDUCTOR DEVICE

(71) Applicant: SUZHOU LEKIN SEMICONDUCTOR CO., LTD., Taicang (CN)

(72) Inventors: Youn Joon Sung, Seoul (KR); Min Sung Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 103 days.

(21) Appl. No.: 17/045,297

(22) PCT Filed: Apr. 5, 2019

(86) PCT No.: PCT/KR2019/004081
§ 371 (c)(1),
(2) Date: Oct. 5, 2020

(87) PCT Pub. No.: WO2019/194646
PCT Pub. Date: Oct. 10, 2019

(65) Prior Publication Data
US 2021/0151627 A1 May 20, 2021

(30) Foreign Application Priority Data
Apr. 5, 2018 (KR) .................. 10-2018-0039891

(51) Int. Cl.
*H01L 33/38* (2010.01)
(52) U.S. Cl.
CPC .......... *H01L 33/382* (2013.01); *H01L 33/387* (2013.01)
(58) Field of Classification Search
CPC ....... H01L 33/20; H01L 33/32; H01L 33/382; H01L 33/387; H01L 33/46
See application file for complete search history.

(56) References Cited

U.S. PATENT DOCUMENTS

| 8,008,683 B2 | 8/2011 | Choi et al. |
| 10,038,127 B2 | 7/2018 | Yang et al. |
| (Continued) | | |

FOREIGN PATENT DOCUMENTS

| EP | 3 474 337 A1 | 4/2019 |
| KR | 10-2012-0138725 A | 12/2012 |
| (Continued) | | |

*Primary Examiner* — Julia Slutsker
*Assistant Examiner* — Dmitriy Yemelyanov
(74) *Attorney, Agent, or Firm* — Birch, Stewart, Kolasch & Birch, LLP (57) ABSTRACT

An embodiment provides a semiconductor device comprising: a semiconductor structure including a first conductive semiconductor layer, a second conductive semiconductor layer, an active layer disposed between the first conductive semiconductor layer and the second conductive semiconductor layer, and a plurality of recesses extending through the second conductive semiconductor layer and the active layer and arranged up to a partial region of the first conductive semiconductor layer; a plurality of first electrodes arranged inside the plurality of recesses and electrically connected to the first conductive semiconductor layer; a second electrode electrically connected to the second conductive semiconductor layer; a first conductive layer electrically connected to the plurality of first electrodes; a second conductive layer electrically connected to the second electrode; and an electrode pad electrically connected to the second conductive layer, wherein the electrode pad comprises a first electrode pad and a second electrode pad which are spaced apart from each other, and the area ratio of the electrode pad to the second conductive layer is 1:20 to 1:27.

19 Claims, 9 Drawing Sheets

(56) References Cited

U.S. PATENT DOCUMENTS

2012/0018764 A1    1/2012  Choi et al.
2018/0219133 A1*   8/2018  Park ........................ H01L 33/26

FOREIGN PATENT DOCUMENTS

| KR | 10-2015-0142235 A | 12/2015 | | |
| KR | 10-2018-0006821 A | 1/2018 | | |
| KR | 10-2018-0010117 A | 1/2018 | | |
| WO | WO 2010/056083 A2 | 5/2010 | | |
| WO | WO-2017034356 A1 * | 3/2017 | ............. | H01L 33/10 |

* cited by examiner

SEMICONDUCTOR DEVICE

CROSS REFERENCE TO RELATED APPLICATIONS

This application is the National Phase of PCT International Application No. PCT/KR2019/004081, filed on Apr. 5, 2019, which claims priority under 35 U.S.C. 119(a) to Patent Application No. 10-2018-0039891, filed in the Republic of Korea on Apr. 5, 2018, all of which are hereby expressly incorporated by reference into the present application.

TECHNICAL FIELD

An embodiment relates to a semiconductor device.

BACKGROUND ART

A semiconductor device including a compound such as GaN, AlGaN, or the like has many advantages such as having wide and easily adjustable band gap energy, and thus can be variously used as a light emitting device, a light receiving device, various diodes, and the like.

Specifically, a light emitting device such as a light emitting diode or a laser diode using a III-V or II-VI compound semiconductor material can implement various colors such as red, green, blue, ultraviolet rays, and the like through the development of thin film growth technology and device materials, can implement white light with good efficiency by using fluorescent materials or combining colors, and has advantages of low power consumption, semi-permanent lifespan, quick response time, safety, environmental friendliness, and the like in comparison with conventional light sources such as a fluorescent lamp, an incandescent lamp, and the like.

In addition, when a light receiving device such as a photodetector or a solar cell is also manufactured using a III-V or II-VI compound semiconductor material, due to the development of device materials, light in various wavelength ranges from a gamma ray range to a radio wavelength range can be used by absorbing light in various wavelength ranges and generating a photocurrent. In addition, the light receiving device has advantages of quick response time, safety, environmental friendliness, and easy adjustment of the device materials, and thus can be easily used for power control, ultra-high frequency circuits, or communication modules.

Accordingly, applications of such semiconductor devices are being expanded to a transmission module of an optical communication means, a light emitting diode backlight replacing a cold cathode fluorescence lamp (CCFL) that constitutes a backlight of a liquid crystal display (LCD) device, a white light emitting diode lighting device capable of replacing a fluorescent or incandescent bulb, a sensor which senses car headlights, traffic lights, gas, or fire, and the like. Further, the applications of such semiconductor devices can be expanded to a high frequency application circuit, other power control devices, and a communication module.

Specifically, an ultraviolet light emitting device can perform a curing or sterilizing action to be used for curing, medical, and sterilizing purposes. Further, since an exhaust gas of a vehicle absorbs light in a wavelength band of 230 nm, the ultraviolet light emitting device can also be used for a gas sensor.

However, since the aluminum composition is increased to generate light in an ultraviolet wavelength range, there is a problem in that current dispersion efficiency is lowered. Accordingly, there is a problem in that light emitting efficiency is lowered when a high current is applied.

SUMMARY

An embodiment is directed to providing a semiconductor device having excellent current dispersion efficiency.

Further, an embodiment is directed to providing a semiconductor device having excellent optical output Problems to be solved by the present invention are not limited to the above-described problems, and purposes and effects understood from solutions and embodiments which will be described below are also included.

One aspect of the present invention provides a semiconductor device including: a semiconductor structure including a first conductive semiconductor layer, a second conductive semiconductor layer, an active layer disposed between the first conductive semiconductor layer and the second conductive semiconductor layer, and a plurality of recesses disposed up to a partial region of the first conductive semiconductor layer through the second conductive semiconductor layer and the active layer; a plurality of first electrodes disposed in the plurality of recesses and electrically connected to the first conductive semiconductor layer; a second electrode electrically connected to the second conductive semiconductor layer; a first conductive layer electrically connected to the plurality of first electrodes; a second conductive layer electrically connected to the second electrode; and an electrode pad electrically connected to the second conductive layer, wherein the electrode pad includes a first electrode pad and a second electrode pad which are spaced apart from each other, and an area ratio of the electrode pad and the second conductive layer ranges from 1:20 to 1:27.

An area ratio of the electrode pad and the plurality of first electrodes may range from 1:1.2 to 1:2.1.

An area ratio of the plurality of first electrodes and the semiconductor structure may range from 1:9 to 1:12.

An area ratio of the second electrode and the semiconductor structure may range from 1:1.1 to 1:2.

The semiconductor device may include a conductive substrate disposed under the second conductive layer and a bonding layer disposed between the second conductive layer and the conductive substrate.

An area ratio of the conductive substrate and the semiconductor structure may range from 1:0.3 to 1:0.6.

An area ratio of the conductive substrate and the electrode pad may range from 1:0.015 to 1:0.04.

The semiconductor device may include a first insulating layer disposed in the recess to insulate the first conductive layer from the active layer and the second conductive semiconductor layer, and a second insulating layer disposed between the first conductive layer and the second conductive layer.

A diameter of the recess may range from 25 μm to 55 μm.

The number of the plurality of recesses may be greater than 79 and smaller than 137.

An average of the number of the plurality of recesses may be 8 to 13 per 100 μm$^2$.

The semiconductor structure may further include a trench disposed along a side surface of the semiconductor structure, and surrounding the plurality of recesses.

The trench may continuously extend along an outer side surface of the semiconductor structure.

An area ratio of the semiconductor structure and the trench may range from 1:0.01 to 1:0.03.

An area ratio of the semiconductor structure and the electrode pad may range from 1:0.02 to 1:0.06.

The active layer may generate light in an ultraviolet wavelength range.

An end of the second conductive layer may be disposed to be spaced apart from a side surface of the semiconductor device and may be covered by the second insulating layer.

The first conductive semiconductor layer, the second conductive semiconductor layer, and the active layer may include aluminum.

Aluminum compositions of the first conductive semiconductor layer and the second conductive semiconductor layer may be different.

The first electrode and the second electrode may include ohmic electrodes.

Advantageous Effects

According to an embodiment, since an area of an electrode, an area of an electrode pad, and an area of epi are adjusted, current dispersion efficiency can be excellent. Accordingly, optical output can be improved.

Various useful advantages and effects of the present invention are not limited to the above and may be relatively easily understood in a process of describing exemplary embodiments of the present invention.

DETAILED DESCRIPTION

The embodiments may be modified into other forms or some of the embodiments may be combined, and the scope of the present invention is not limited to embodiments which will be described below.

Although items described in a specific embodiment are not described in another embodiment, the items may be understood as a description related to the other embodiment unless a description contrary to or contradicting the items is in the other embodiment.

For example, when a characteristic of a component A is described in a specific embodiment and a characteristic of a component B is described in another embodiment, the characteristics of the components are understood to fall within the scope of the present invention unless a contrary or contradictory description is present even when an embodiment in which the component A and the component B are combined is not clearly disclosed.

In the description of the embodiments, when one element is disclosed to be formed "on or under" another element, the term "on or under" includes both a case in which the two elements are in direct contact with each other and a case in which at least one other element is disposed between the two elements (indirect contact). Further, when the term "on or under" is expressed, a meaning of not only an upward direction but also a downward direction with respect to one element may be included.

Hereinafter, embodiments of the present invention will be described in detail with reference to the accompanying drawings so that those skilled in the art may easily carry out the embodiment of the present invention.

A semiconductor structure according to an embodiment of the present invention may emit light in an ultraviolet wavelength range. For example, the semiconductor structure may emit light in a near ultraviolet wavelength range (ultraviolet (UV)-A), may emit light in a far ultraviolet wavelength range (UV-B), and may emit light in a deep ultraviolet wavelength range (UV-C). The wavelength range may be determined by a composition ratio of Al in a semiconductor structure 120.

For example, the light in the near ultraviolet wavelength range (UV-A) may have a peak wavelength ranging from 320 nm to 420 nm, the light in the far ultraviolet wavelength range (UV-B) may have a peak wavelength ranging from 280 nm to 320 nm, and the light in the deep ultraviolet wavelength range (UV-C) may have a peak wavelength ranging from 100 nm to 280 nm.

When the semiconductor structure 120 emits light in the ultraviolet wavelength range, each layer of the semiconductor structure 120 may have an $In_{x1}Al_{y1}Ga_{1-x1-y1}N$ (x1 is 0 to 1, y1 is greater than 0 and smaller than or equal to 1, x1+y1 is 0 to 1) composition including aluminum. Here, an Al composition may be represented by a ratio of a total atomic weight including an In atomic weight, a Ga atomic weight, and an Al atomic weight of and the Al atomic weight. For example, when the Al composition is 40%, the Ga composition may be 60%, and this composition ratio may be expressed as $Al_{40}Ga_{60}N$.

Further, in the description of the embodiment, a meaning in which the composition is low or high may be understood as a difference (a % point) in composition % of each semiconductor layer. For example, when the aluminum composition of a first semiconductor layer is 30% and the aluminum composition of a second semiconductor layer is 60%, the aluminum composition of the second semiconductor layer may be expressed as 30% higher than the aluminum composition of the first semiconductor layer.

Figure 1:
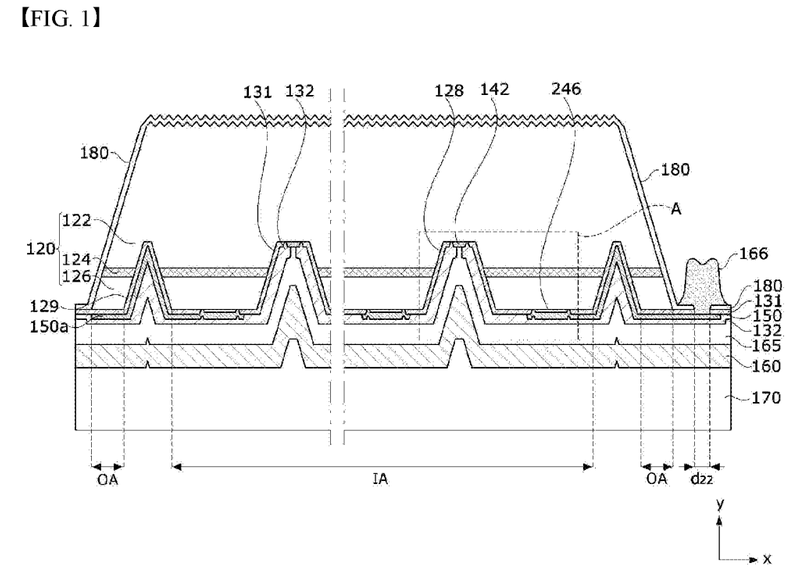
FIG. 1 is a conceptual diagram of a semiconductor device according to a first embodiment of the present invention.
Figure 2:
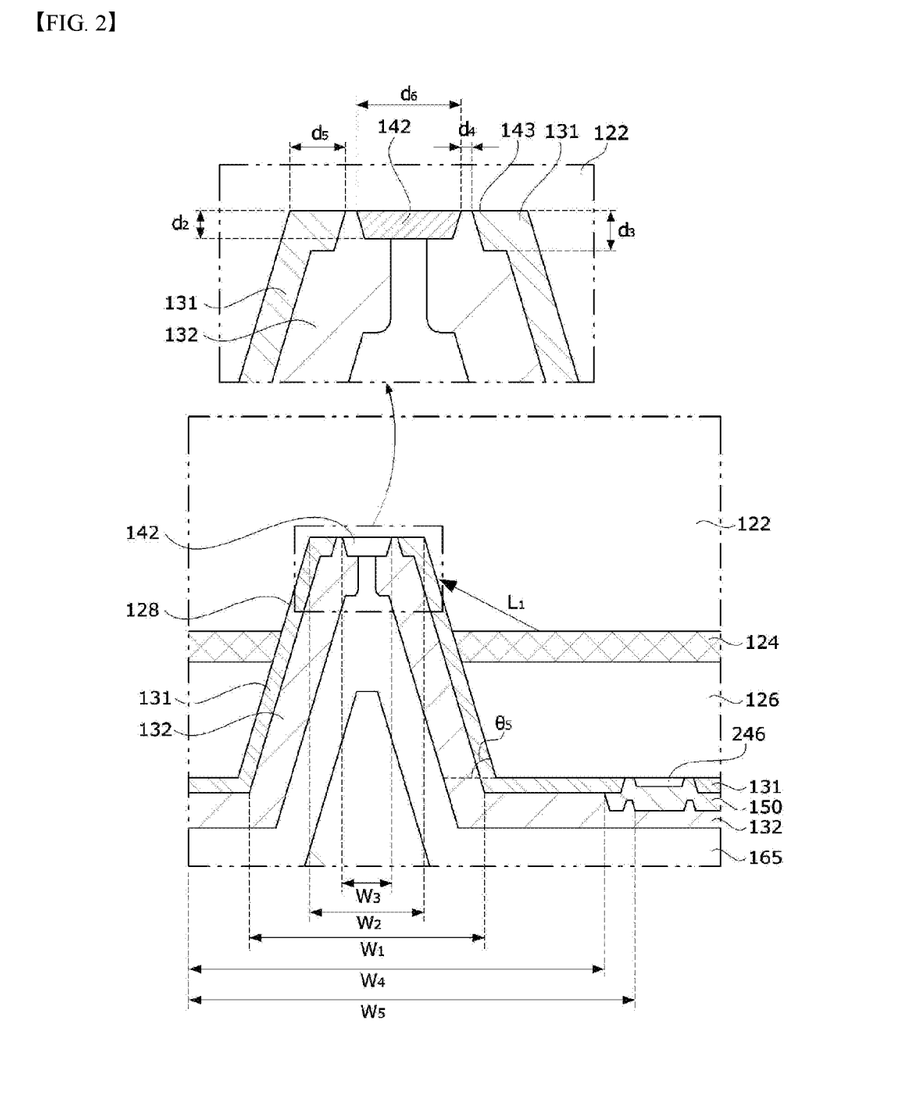
FIG. 2 is an enlarged view of portion A in FIG. 1.

FIG. 1 is a conceptual diagram of a semiconductor device according to a first embodiment of the present invention, and FIG. 2 is an enlarged view of portion A in FIG. 1.

The semiconductor structure 120 may include a plurality of recesses 128 formed up to a partial region of a first conductive semiconductor layer 122 through a second conductive semiconductor layer 126 and an active layer 124.

The first conductive semiconductor layer 122 may be implemented with a group III-V or II-VI compound semiconductor, and may be doped with a first dopant. The first conductive semiconductor layer 122 may be selected from a semiconductor material having a composition formula of $In_{x1}Al_{y1}Ga_{1-x1-y1}N$ (x1 is 0 to 1, y1 is 0 to 1, and x1+y1 is 0 to 1), for example, GaN, AlGaN, InGaN, InAlGaN, and the like. Further, the first dopant may be an n-type dopant such as Si, Ge, Sn, Se, and Te. When the first dopant is an n-type dopant, the first conductive semiconductor layer 122 doped with the first dopant may be an n-type semiconductor layer.

The active layer 124 is a layer in which electrons (or holes) injected through the first conductive semiconductor layer 122 and holes (or electrons) injected through the second conductive semiconductor layer 126 meet. The active layer 124 transitions to a low energy level due to recombination of the electrons and the holes, and may generate light having a wavelength corresponding thereto.

The active layer 124 may have one structure of a single well structure, a multiple well structure, a single quantum well structure, a multi quantum well (MQW) structure, a quantum dot structure, and a quantum wire structure, and a structure of the active layer 124 is not limited thereto. The active layer may include Al.

The second conductive semiconductor layer 126 may be formed on the active layer 124, may be implemented with a group III-V or II-VI compound semiconductor, and may be doped with a second dopant. The second conductive semiconductor layer 126 may be selected from a semiconductor material having a composition formula of $In_{x5}Al_{y2}Ga_{1-x5-y2}N$ (x5 is 0 to 1, y2 is 0 to 1, and x5+y2 is 0 to 1), or a material selected from AlInN, AlGaAs, GaP, GaAs, GaAsP, AlGaInP. When the second dopant is a p-type dopant such as Mg, Zn, Ca, Sr, Ba, or the like, the second conductive semiconductor layer 126 doped with the second dopant may be a p-type semiconductor layer.

A first electrode 142 may be disposed in an upper surface of the recess 128 to be electrically connected to the first conductive semiconductor layer 122. A second electrode 246 may be disposed under the second conductive semiconductor layer 126.

The first electrode 142 and the second electrode 246 may be ohmic electrodes. The first electrode 142 and the second electrode 246 may be formed by including at least one of indium tin oxide (ITO), indium zinc oxide (IZO), indium zinc tin oxide (IZTO), indium aluminum zinc oxide (IAZO), and indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au or Ni/IrOx/Au/ITO, Ag, Ni, Cr, Ti, Al, Rh, Pd, Ir, Sn, In, Ru, Mg, Zn, Pt, Au, and Hf, but are not limited to these materials.

An electrode pad 166 may be disposed in one side corner region of the semiconductor device. The electrode pad 166 has a recessed center portion and thus may have a concave portion and a convex portion in an upper surface thereof. A wire (not shown) may be bonded to the concave portion of the upper surface. Accordingly, since an adhesion area is enlarged, the electrode pad 166 and the wire may be more firmly bonded. Since a first insulating layer 131 is partially opened under the electrode pad 166, a second conductive layer 150 and the second electrode 246 may be electrically connected.

Since the first insulating layer 131 is open, a width d22 of a portion where the second electrode 246 comes into contact with the second conductive layer 150 may be, for example, 40 µm to 90 µm. When the width d22 is smaller than 40 µm, there is a problem in that an operating voltage increases, and when the width d22 is larger than 90 µm, securing a process margin for not exposing the second conductive layer 150 to the outside may be difficult. When the second conductive layer 150 is exposed to an outer region of the second electrode 246, reliability of the device may be deteriorated. Accordingly, preferably, the width d22 may be 60% to 95% of a total width of the second electrode 246.

Passivation layers 180 may be formed on an upper surface and side surfaces of the semiconductor structure 120. The passivation layers 180 may come into contact with the first insulating layer 131 in a region adjacent to the second electrode 246 or under the second electrode 246.

Referring to FIG. 2, when the Al composition of the semiconductor structure 120 increases, current diffusion characteristics in the semiconductor structure 120 may be deteriorated. Further, an amount of light emitted to the side of the active layer 124 increases in comparison with a GaN-based blue light emitting device (a transverse magnetic (TM) mode). This TM mode may occur in an ultraviolet semiconductor device.

According to the embodiment, for current diffusion, the first electrode 142 may be disposed by forming a relatively large number of recesses 128 in comparison with a general GaN semiconductor.

The first insulating layer 131 may electrically insulate the first electrode 142 from the active layer 124 and the second conductive semiconductor layer 126. Further, the first insulating layer 131 may electrically insulate the second electrode 246 and the second conductive layer 150 from a first conductive layer 165.

The first insulating layer 131 may be formed by selecting at least one from the group consisting of $SiO_2$, SixOy, $Si_3N_4$, SixNy, SiOxNy, $Al_2O_3$, $TiO_2$, AN, and the like, but is not limited thereto. The first insulating layer 131 may be formed as a single layer or multiple layers. For example, the first insulating layer 131 may be a distributed Bragg reflector (DBR) having a multilayer structure including Si oxide or a Ti compound. However, the present invention is not necessarily limited thereto, and the first insulating layer 131 may include various reflective structures.

When the first insulating layer 131 performs a reflective function, light L1 emitted from the active layer 124 toward a side surface may be reflected upward to enhance light extraction efficiency. As described later, when the number of recesses 128 increases, light extraction efficiency may be more effective.

A diameter W3 of the first electrode 142 may be 24 µm to 50 µm. When this range is satisfied, it may be advantageous for current dispersion, and a large number of first electrodes 142 may be disposed.

A diameter W1 of the recess 128 may be 30 µm or more and 60 µm or less. The diameter W1 of the recess 128 may be disposed under the second conductive semiconductor layer 126 to be defined as the largest area in the recess.

When the diameter W1 of the recess 128 is smaller than 30 securing a process margin while forming the first electrode 142 disposed in the recess 128 is difficult, and when the diameter W1 is larger than 60 since a volume of the active layer 124 adjacent to the first electrode 142, which is to be removed, increases, light emitting efficiency may be deteriorated.

A diameter W2 of an upper surface 143 of the recess 128 may be 30 μm to 58 μm.

An inclination angle θ5 of the recess 128 may be 70° to 90°. When this range is satisfied, it may be advantageous for forming the first electrode 142 on the upper surface, and a large number of recesses 128 may be formed.

When the inclination angle θ5 is smaller than 70°, since a region of the active layer 124 to be removed increases, light emitting efficiency may be deteriorated. The areas of the first electrode 142 and the second electrode 246 may be adjusted using the inclination angle θ5 of the recess 128.

The inclination angle θ5 of the recess 128 and an inclination angle of a trench 129 may be the same. However, the present invention is not limited thereto, and the inclination angles of the trench 129 and the recess 128 may be different.

For example, the inclination angle of the trench 129 may be larger than the inclination angle of the recess 128. In this case, an area of an active region IA1 may be increased by reducing a width of the trench 129. Alternatively, the inclination angle of the trench 129 may be smaller than the inclination angle of the recess 128. In this case, reliability may be improved by increasing a separation distance between the active region IA1 and a non-active region OA1 of the active layer 124.

The first electrode 142 may have a thickness d2 smaller than a thickness d3 of the first insulating layer 131, and may have a separation distance d4 of 0 μm to 4 μm from the first insulating layer 131.

In the case in which the thickness d2 of the first electrode 142 is smaller than the thickness d3 of the first insulating layer 131, problems such as peeling, cracking, and the like due to step coverage characteristic deterioration which occur when the first conductive layer 165 is disposed may be solved. Further, gap-fill characteristics of a second insulating layer 132 may be improved by having the separation distance d4 with the first insulating layer 131.

The separation distance d4 between the first electrode 142 and the first insulating layer 131 may be 0 μm to 4 μm.

When the separation distance d4 between the first electrode 142 and the first insulating layer 131 is larger than 4 μm, since the width of the first insulating layer 131 disposed on the upper surface of the recess 128 is reduced, securing a process margin becomes difficult, and thus reliability may be deteriorated. Further, since the width W3 of the first electrode 142 is reduced, an operating voltage characteristic may be deteriorated.

The upper surface 143 of the recess 128 may include a first region d5 where the first insulating layer 131 and the first conductive semiconductor layer 122 come into contact, a second region d4 where the second insulating layer 132 and the first conductive semiconductor layer 122 come into contact, and a third region d6 where the first electrode 142 and the first conductive semiconductor layer 122 come into contact. The third region d6 may be the same as a width W of the first electrode 142.

When the first insulating layer 131 and the second insulating layer 132 are composed of the same material, the first insulating layer 131 and the second insulating layer 132 may not be distinguished from each other by physical and/or chemical bonding. In this case, the sum of a width of the first region d5 and a width of the second region d4 may be defined as the width of the first region d5 or the width of the second region d4.

When the width of the first region d5 increases, the third region d6 may be narrowed, and when the width of the first region d5 increases, the third region d6 may be widened.

The width of the first region d5 may be 11 μm to 28 μm. When the width of the first region d5 is smaller than 11 μm, securing the process margin is difficult and thus reliability of the device may be deteriorated, and when the width of the first region d5 is larger than 28 μm, the width W3 of the first electrode 142 decreases, and thus electrical characteristics may be deteriorated.

A width of the third region d6 may be determined by adjusting the width of the first region d5 and the width of the second region d4. The width of the recess 128 may be freely designed within the above-described range so that current distribution throughout the device may be uniform and current injection may be optimized.

Further, an area of the recess 128 may be determined by adjusting the widths of the first region d5, the second region d4, and the third region d6. When the area of the recess 128 increases, an area in which the second electrode 246 may be disposed decreases. Accordingly, a ratio of the first electrode 142 and the second electrode 246 may be determined, and in order to optimize a current density by matching the density of electrons and holes, the width of the recess 128 may be freely designed within the above-described range.

A thickness of the second electrode 246 may be smaller than a thickness of the first insulating layer 131.

The second electrode 246 may have a first separation distance from the first insulating layer 131 of 1 μm to 4 μm. When the first separation distance is smaller than 1 μm, since securing a process margin becomes difficult, reliability may be deteriorated. Further, when the first separation distance is larger than 4 μm, since an area in which the second electrode 246 is disposed decreases, there is a problem in that an operating voltage increases.

The second conductive layer 150 may cover the second electrode 246. Accordingly, the electrode pad 166, the second conductive layer 150, and the second electrode 246 may form one electrical channel.

The second conductive layer 150 may come into contact with side surfaces and an upper surface of the first insulating layer 131 while completely surrounding the second electrode 246. The second conductive layer 150 may be formed of a material having good adhesion with the first insulating layer 131, and may be formed of at least one material selected from the group consisting of materials such as Cr, Al, Ti, Ni, Au, and the like, or an alloy thereof. Further, the second conductive layer 150 may be formed as a single layer or a plurality of layers.

When the second conductive layer 150 comes into contact with the side surfaces and the upper surface of the first insulating layer 131, thermal and electrical reliability of the second electrode 246 may be enhanced. Further, the second conductive layer 150 may have a reflective function to reflect light emitted between the first insulating layer 131 and the second electrode 246 upward.

The second conductive layer 150 may be disposed at a second separation distance between the first insulating layer 131 and the second electrode 246. The second conductive layer 150 may come into contact with side surfaces and an upper surface of the second electrode 246 and the side surfaces and the upper surface of the first insulating layer 131 at the second separation distance.

Further, a region in which the second conductive layer 150 and the second conductive semiconductor layer 126 come into contact to form a Schottky junction may be disposed within the second separation distance, and current distribution is facilitated by forming the Schottky junction.

The second insulating layer 132 electrically insulates the second electrode 246 and the second conductive layer 150 from the first conductive layer 165. The first conductive layer 165 may pass through the second insulating layer 132 to be electrically connected to the first electrode 142.

The second conductive layer 150 may electrically connect the second electrode 246 and the electrode pad 166.

In this case, an end 150a of the second conductive layer 150 may be disposed to be spaced apart from a side surface of a chip and may be covered by the second insulating layer 132. Accordingly, since the end of the second conductive layer 150 is blocked from the outside, reliability may be improved.

Further, a trench 129 (a second recess) surrounding a plurality of recesses 128 (a first recess) may be disposed on the side surfaces of the semiconductor structure 120. The trench 129 may be continuously formed along the side surfaces of the semiconductor structure 120 to form a line. Accordingly, since it is possible to prevent penetration of contaminants into the active layer 124, reliability may be improved.

The trench 129 may continuously extend along the side surfaces of the semiconductor structure 120. The trench 129 may be a single recess extending along an outer side surface of the semiconductor structure 120 to form a closed loop, but is not limited thereto, and may be divided into a plurality of recesses.

By the trench 129, the active layer 124 may be separated into the non-active region OA1 disposed at an outer side of the trench 129 and the active region IA1 disposed at an inner side of the trench 129.

The plurality of recesses 128 may be disposed at the inner side of the trench 129. The recess 128 may have a first electrode 142 disposed therein to serve as a path for injecting a current into the first conductive semiconductor layer 122.

The non-active region OA1 is a non-light emitting region in which electron-hole recombination does not substantially occur, and the active region IA1 may be a region in which the current is dispersed to emit light.

An area of the active region IA1 disposed at the inner side of the trench 129 may be larger than an area of the non-active region OA1 disposed at the outer side of the trench 129.

A ratio of the maximum area of the semiconductor structure 120 and the maximum area of the trench 129 may be 1:0.01 to 1:0.03. When the ratio of the maximum area of the semiconductor structure 120 and the maximum area of the trench 129 is smaller than 1:0.01, it may be difficult to be prevent oxidation of the active layer 124 from contaminants. Further, when the ratio of the maximum area of the semiconductor structure 120 and the maximum area of the trench 129 is larger than 1:0.03, light efficiency may be deteriorated In the case of an ultraviolet light emitting device, since the aluminum composition in the active layer 124 is relatively high, it may be more susceptible to oxidation. Accordingly, when a sidewall of the semiconductor structure 120 is exposed due to cracks or the like, the active layer 124 is rapidly oxidized and optical output may be reduced.

According to the embodiment, the trench 129 may be disposed between the non-active region OA1 and the active region IA1 to serve as a barrier. Further, a separation distance between the non-active region OA1 and the active region IA1 may be increased by the trench 129. Accordingly, even when the non-active region OA1 of the active layer 124 is oxidized, the active region IA1 of the active layer 124 may be prevented from being oxidized by the trench 129.

The first conductive layer 165 and a bonding layer 160 may be disposed along a lower surface of the semiconductor structure 120 and a shape of the recess 128. The first conductive layer 165 may be made of a material having excellent reflectivity. For example, the first conductive layer 165 may include aluminum. When the first conductive layer 165 includes aluminum, it serves to upwardly reflect light emitted from the active layer 124 toward a substrate 170, and accordingly, the light extraction efficiency may be enhanced.

The bonding layer 160 may include a conductive material. For example, the bonding layer 160 may include a material selected from the group consisting of gold, tin, indium, aluminum, silicon, silver, nickel, and copper, or an alloy thereof.

The substrate 170 may be formed of a conductive material. For example, the substrate 170 may include a metal or semiconductor material. The substrate 170 may be a metal having excellent electrical conductivity and/or thermal conductivity. In this case, heat generated during the operation of the semiconductor device may be quickly dissipated to the outside.

The substrate 170 may include a material selected from the group consisting of silicon, molybdenum, silicon, tungsten, copper, and aluminum, or an alloy thereof.

The electrode pad 166 may be formed of a conductive material. The electrode pad 166 may have a single layer structure or a multilayer structure, and may include titanium (Ti), nickel (Ni), silver (Ag), and gold (Au). For example, the electrode pad 166 may have a structure of Ti/Ni/Ti/Ni/Ti/Au.

An unevenness may be formed on the upper surface of the semiconductor structure 120. This unevenness may enhance extraction efficiency of light emitted from the semiconductor structure 120. The unevenness may have different average heights depending on the UV wavelength, and in the case of UV-C, light extraction efficiency may be improved when the height is approximately 300 nm to 800 nm and the average height is approximately 500 nm to 600 nm.

Figure 3:
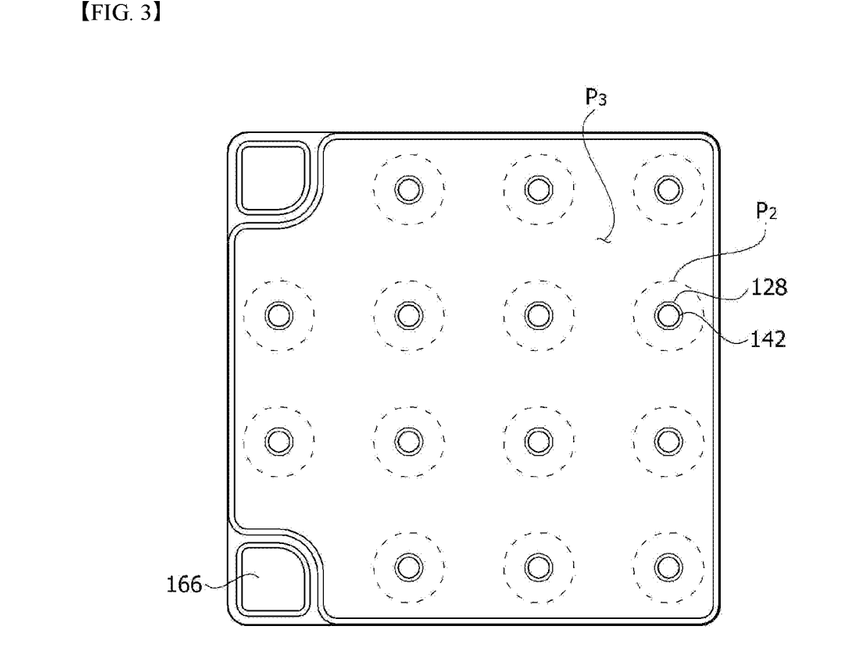
FIGS. 3 and 4 are views for describing a configuration in which optical output is enhanced according to a change in the number of recesses
Figure 4:
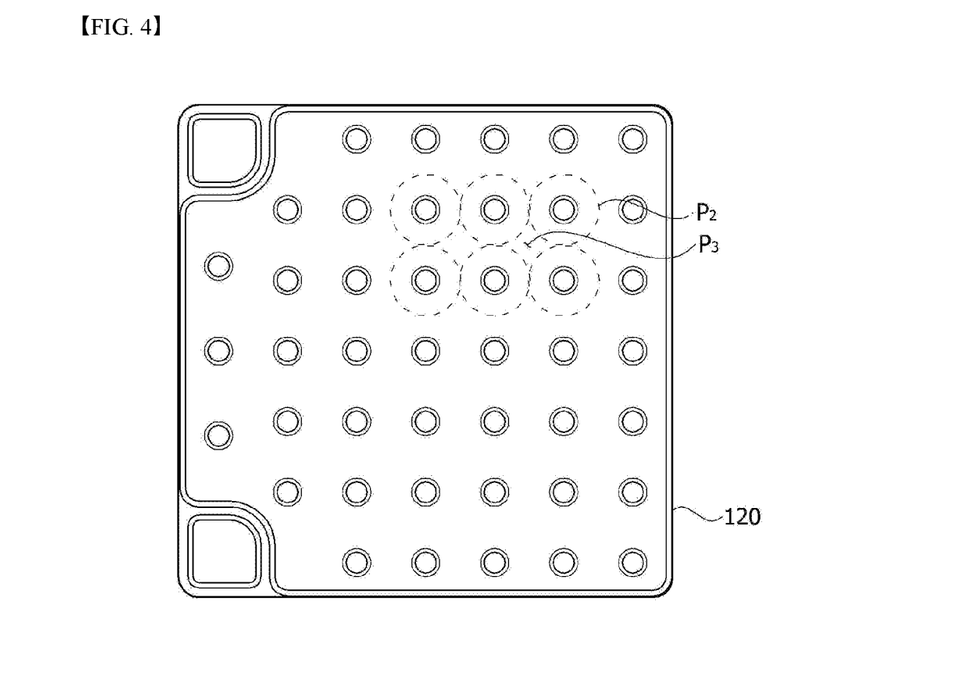
Figure 5:
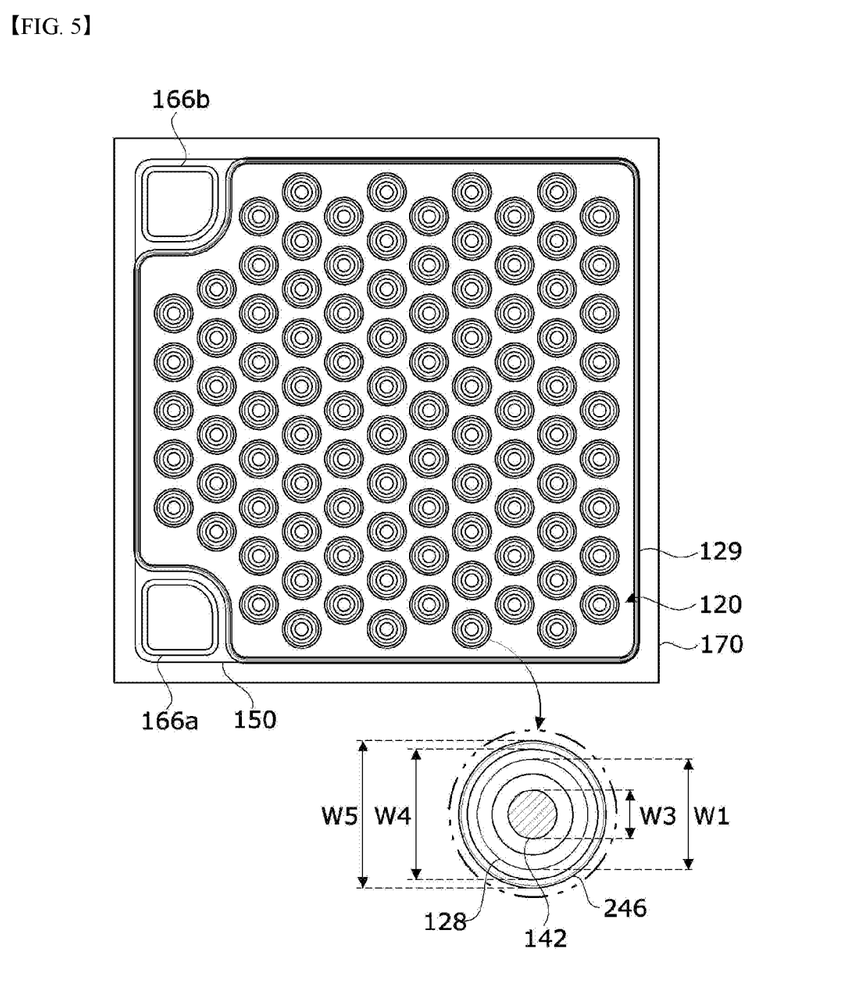
FIG. 5 is a plan view of the semiconductor device according to the first embodiment of the present invention.
Figure 6A:
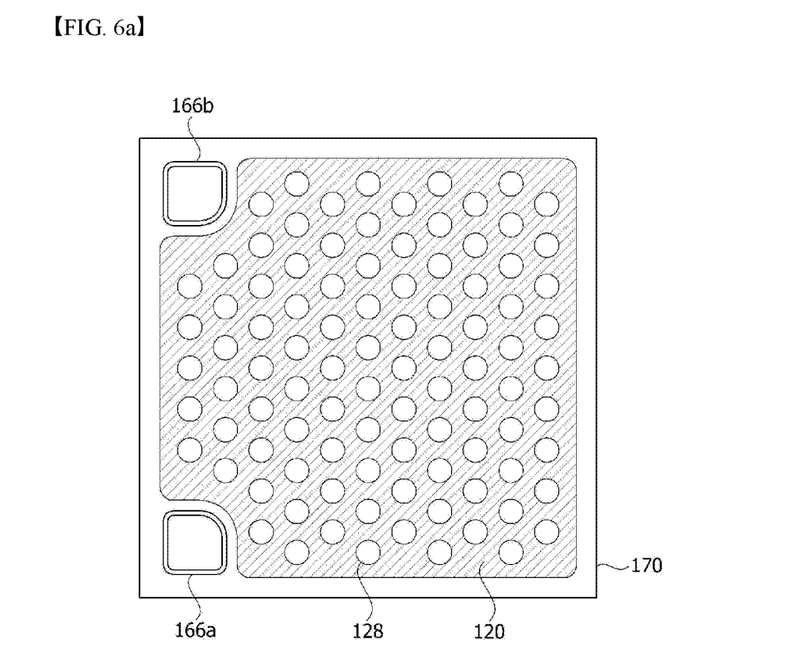
FIG. 6A is a plan view illustrating a semiconductor structure in FIG. 5.
Figure 6B:
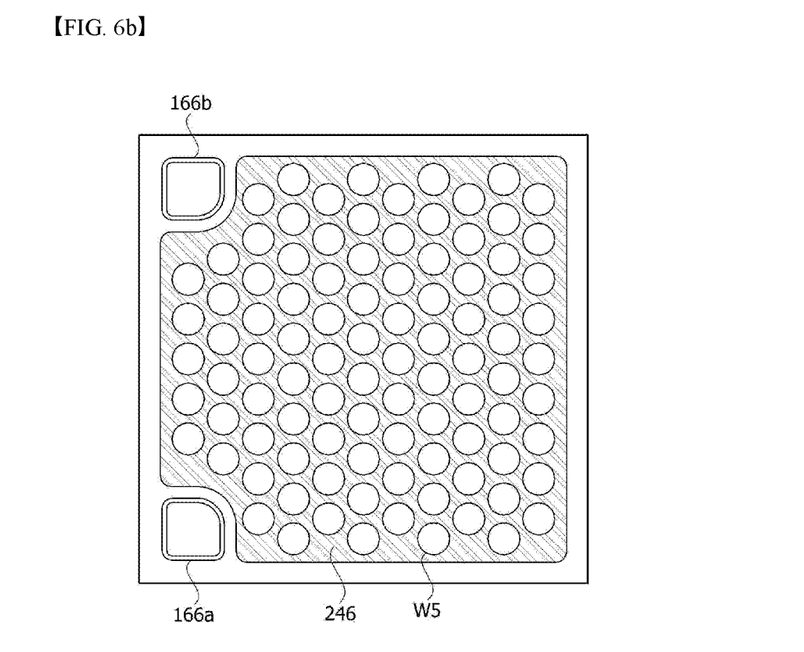
FIG. 6B is a plan view illustrating a second electrode in FIG. 5.
Figure 6C:
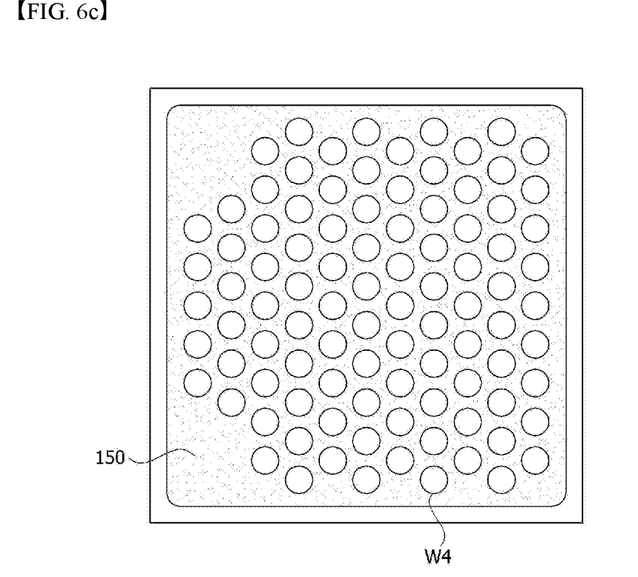
FIG. 6C is a plan view illustrating a second conductive layer in FIG. 5.

FIGS. 3 and 4 are views for describing a configuration in which the optical output is enhanced according to a change in the number of recesses, FIG. 5 is a plan view of the semiconductor device according to the first embodiment of the present invention, FIG. 6A is a plan view illustrating the semiconductor structure in FIG. 5, FIG. 6B is a plan view illustrating the second electrode in FIG. 5, and FIG. 6C is a plan view illustrating the second conductive layer in FIG. 5.

Referring to FIG. 3, when the Al composition increases, current dispersion characteristics may be deteriorated. Accordingly, a current is dispersed to only a point adjacent to each of the first electrodes 142, and a current density may be sharply lowered at a distant point. Accordingly, effective light emitting regions P2 may be reduced.

The effective light emitting region P2 may be defined as a region up to a boundary point where the current density is 40% or less based on the current density in the first electrode 142 having the highest current density. Further, the effective light emitting region P2 may be defined as a region which is 2 to 5 times a diameter of the first electrode 142. For example, a distance of 5 μm to 40 μm from a center of the recess 128 may be defined as the boundary point. However, the effective light emitting region P2 may be variable depending on a level of an injection current and the concentration of Al.

A low current density region P3 between the effective light emitting regions P2 has a low current density and may hardly contribute to light emission. Accordingly, in the embodiment, optical output may be enhanced by further disposing the first electrode 142 in the low current density region P3 having a low current density. For example, in the case of FIG. 4 compared to FIG. 3, it can be seen that the area of the low current density region P3 has been further reduced.

Generally, in the case of a GaN semiconductor layer, since the current dispersion characteristics are relatively excellent, it is desirable to minimize the areas of the recess and the first electrode. This is because the area of the active layer decreases when the areas of the recess and the first electrode increase.

However, in the case of the embodiment, in order to emit ultraviolet light, the active layer should include Al, and in order to secure crystallinity, the first conductive semiconductor layer and the second conductive semiconductor layer need to contain Al.

Accordingly, there is a problem in that the Al composition of the first and second conductive semiconductor layers increases, and thus resistance increases, and the current diffusion characteristics are deteriorated. Accordingly, it may be desirable to increase the number of first electrodes even if the area of the active layer is sacrificed.

FIG. 5 is a plan view of the semiconductor device according to the first embodiment of the present invention, FIG. 6A is a plan view illustrating the semiconductor structure in FIG. 5, FIG. 6B is a plan view illustrating the second electrode in FIG. 5, and FIG. 6C is a plan view illustrating the second conductive layer in FIG. 5.

Referring to FIG. 5, the number of recesses 128 may be roughly 96. According to this configuration, the low current density region is reduced and thus the optical output may increase. That is, since a current is uniformly distributed over an entire region of the active layer, the optical output may increase.

In a plan view, the first electrodes 142 may be surrounded by the recesses 128, and the recesses 128 may be disposed in holes W4 formed in the second conductive layer 150. Further, the holes W4 of the second conductive layer 150 may be disposed in holes W5 formed in the second electrode 246. The diameter W3 of the first electrode 142 may be 24 μm to 50 μm, and the diameter W1 of the recess 128 may be 38 μm to 60 μm, but the present invention is not limited thereto.

Referring to FIG. 6A, the semiconductor structure 120 may have a shape connected as a whole other than a region in which the recesses 128 are formed. The area of the semiconductor structure may be the largest area on the plane, and may also be the area of the active layer of the semiconductor structure.

Referring to FIG. 6B, an area of the second electrode 246 may be defined as an area other than a plurality of holes W5 formed therein. The second electrode 246 may come into contact with a lower portion of the semiconductor structure 120 in a region other than a region in which the holes W5 surrounding the recesses 128 are disposed.

Referring to FIG. 6C, an area of the second conductive layer 150 may be defined as an area other than a plurality of holes W4 formed therein. In this case, the second conductive layer 150 may be formed up to and electrically connected to a region in which the electrode pad is disposed. Accordingly, the area of the second conductive layer 150 may be larger than the area of the semiconductor structure 120.

Referring to FIG. 5 again, in order to increase the number of recesses 128 and the number of first electrodes 142, it may be considered that only one electrode pad is disposed. However, when only the one electrode pad is disposed, since an area of the pad is relatively small, the current dispersion efficiency may be deteriorated. Further, since resistance increases, current injection efficiency may be deteriorated when a high current is applied. The current injection efficiency may be a ratio of an amount of a current which reaches the active layer when the current is supplied to an optical device from the outside.

Accordingly, a plurality of electrode pads 166a and 166b according to the embodiment may be disposed. Accordingly, since an electrode area is wider, the current injection efficiency may be excellent even when the high current is applied. A pad of the first electrode 142 and a pad of the second electrode 246 may be respectively disposed at the corners of the semiconductor device, but positions of the electrode pads 166a and 166b are not particularly limited.

An area ratio (semiconductor structure: electrode pad) of the semiconductor structure 120 and the electrode pads 166a and 166b may be 1:0.02 to 1:0.06. When the area ratio is 1:0.02 or more, since the areas of the electrode pads 166a and 166b increase, the current dispersion efficiency may be excellent even when the high current is applied. Further, when the area ratio is 1:0.06 or less, a light emitting area of the semiconductor structure 120 may be secured to maintain sufficient optical output.

An area ratio of the conductive substrate 170 and the semiconductor structure 120 may be 1:0.3 to 1:0.6. When the area ratio is 1:0.3 or more, since the area of the semiconductor structure 120 increases, the optical output may be improved. When the area ratio is 1:0.6 or less, since an interval between the recesses is appropriately maintained, the low current density region may be reduced. Accordingly, the optical output may be improved. Further, since the areas of the electrode pads 166a and 166b are secured, the current dispersion efficiency may be excellent even when the high current is applied.

A size of the semiconductor device may be the same as a size of the conductive substrate 170. For example, the size of the semiconductor device may be 1000 μm in width and height. In this case, the number of the plurality of recesses 128 may be 8 to 13 per 100 μm$^2$. When the number of recesses 128 is 8 per 100 μm$^2$ or more, since the number of recesses is appropriately distributed, the low current density region may be reduced. Accordingly, optical output efficiency may increase. When the number of recesses 128 is 13 per 100 μm$^2$ or less, the light emitting area of the semiconductor structure 120 is secured to maintain sufficient optical output.

An area ratio of the electrode pads 166a and 166b and the second conductive layer 150 may be 1:20 to 1:27. When the area ratio is 1:20 or more, since the area of the second conductive layer 150 increases, a decrease in current dispersion efficiency when the high current is applied may be prevented. Further, when the area ratio is 1:27 or less, since the areas of the electrode pads 166a and 166b increase, the current dispersion efficiency may be improved when the high current is applied.

The area ratio between the electrode pads 166a and 166b and the plurality of first electrodes 142 may be 1:1.2 to 1:2.1. When the area ratio is 1:1.2 or more, since the areas of the first electrodes 142 increase, the low current density region is reduced, and thus the optical output may be improved. Further, when the area ratio is 1:2.1 or less, since the area of the active layer may be sufficiently secured, the optical output may be improved.

Further, an area ratio of the plurality of first electrodes 142 and the semiconductor structure 120 may be 1:9 to 1:12. When the area ratio is 1:9 or more, since the area of the semiconductor structure 120 increases, the optical output may be improved, and when the area ratio is 1:12 or less, since the number of first electrodes 142 is sufficiently secured, the current dispersion efficiency may be improved.

Further, an area ratio of the second electrode 246 and the semiconductor structure 120 may be 1:1.1 to 1:2. When the area ratio is 1:1.1 or more, since the area of the semiconductor structure 120 increases, the optical output may be improved, and when the area ratio is smaller than or equal to 1:2, the area of the second electrode 246 increases, and thus the current dispersion efficiency may be improved.

Further, an area ratio of the conductive substrate 170 and the electrode pads 166a and 166b may be 1:0.015 to 1:0.04. When the area ratio is 1:0.015 or more, since the areas of the electrode pads 166a and 166b increase, the current dispersion efficiency may be excellent even when the high current is injected, and when the area ratio is 1:0.04 or less, the areas of the electrode pads 166a and 166b may decrease so that the areas of the active layer and the first electrode 142 may increase. Accordingly, the optical output may be improved.

For example, an entire area of the chip may be 1,000,000 $\mu m^2$, the area of the semiconductor structure 120 may be 548,588 $\mu m^2$, the area of each of the electrode pads 166a and 166b may be 27,212 $\mu m^2$, the area of the first electrode 142 may be 50,969 $\mu m^2$, the area of the second electrode 246 may be 472,620 $\mu m^2$, and the area of the second conductive layer 150 may be 651,865 $\mu m^2$. However, the area of each component may be adjusted within the above-described ratio.

Figure 7:
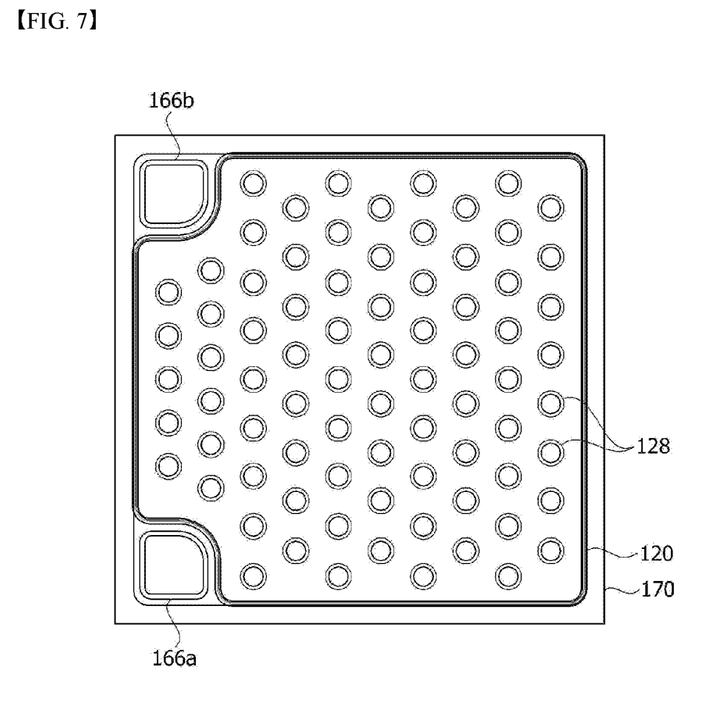
FIG. 7 is a plan view of a semiconductor device according to a second embodiment of the present invention.
Figure 8:
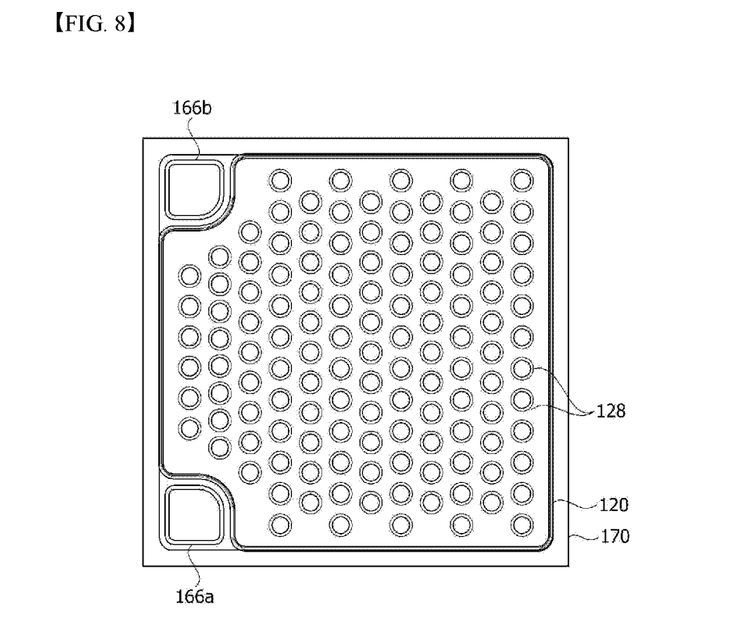
FIG. 8 is a plan view of a semiconductor device according to a third embodiment of the present invention.
Figure 9:
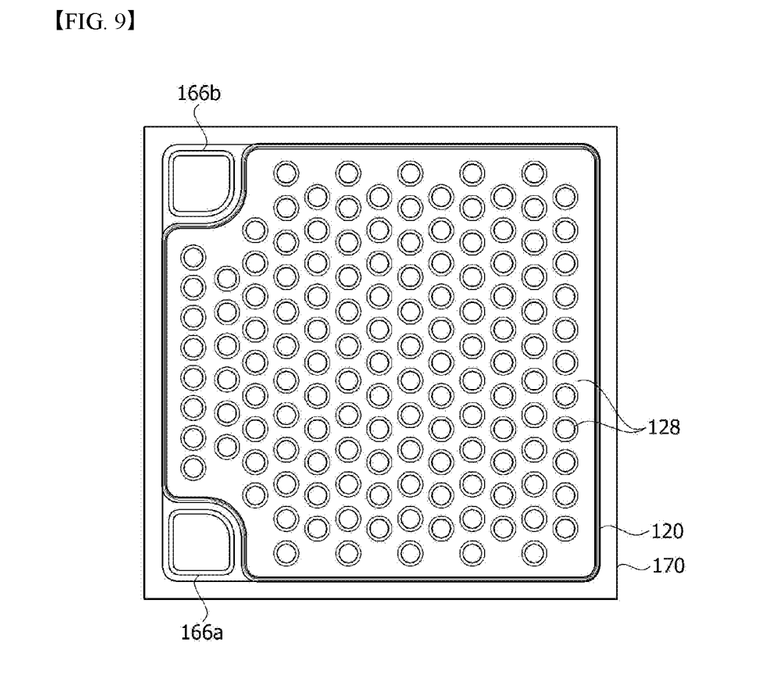
FIG. 9 is a plan view of a semiconductor device according to a fourth embodiment of the present invention.

FIG. 7 is a plan view of a semiconductor device according to a second embodiment of the present invention, FIG. 8 is a plan view of a semiconductor device according to a third embodiment of the present invention, and FIG. 9 is a plan view of a semiconductor device according to a fourth embodiment of the present invention.

Referring to FIG. 7, the number of recesses 128 has decreased to 79. Accordingly, compared to FIG. 5, the area of the first electrode 142 decreases, while the area of the second electrode 246 relatively increases. For example, the area of the first electrode 142 may be 41,943 $\mu m^2$, and the area of the second electrode 246 may be 516,414 $\mu m^2$, but the present invention is not limited thereto. The areas of the electrode pads 166a and 166b, the chip size, the area of the semiconductor structure 120, the diameter of the first electrode, and the diameter of the recess may be the same as those in FIG. 5.

Referring to FIG. 8, the number of recesses 128 has increased to 116. Accordingly, compared to FIG. 5, the area of the first electrode 142 increases, while the area of the second electrode 246 relatively decreases. For example, the area of the first electrode 142 may be 61,588 $\mu m^2$, and the area of the second electrode 246 may be 389,829 $\mu m^2$, but the present invention is not limited thereto. The areas of the electrode pads 166a and 166b, the chip size, the area of the semiconductor structure 120, the diameter of the first electrode, and the diameter of the recess may be the same as those in FIG. 5. Accordingly, even when the number of recesses increases, since the areas of the electrode pads are secured, the current dispersion efficiency may be improved.

Referring to FIG. 9, the number of recesses 128 may be 137. Accordingly, compared to FIG. 5, the area of the first electrode 142 increases, while the area of the second electrode 246 relatively decreases. For example, the area of the first electrode 142 may be 72,737 $\mu m^2$, and the area of the second electrode 246 may be 317,984 $\mu m^2$. However, the areas of the electrode pads 166a and 166b, the chip size, and the area of the semiconductor structure 120 may be the same as those in FIG. 5.

Figure 10:
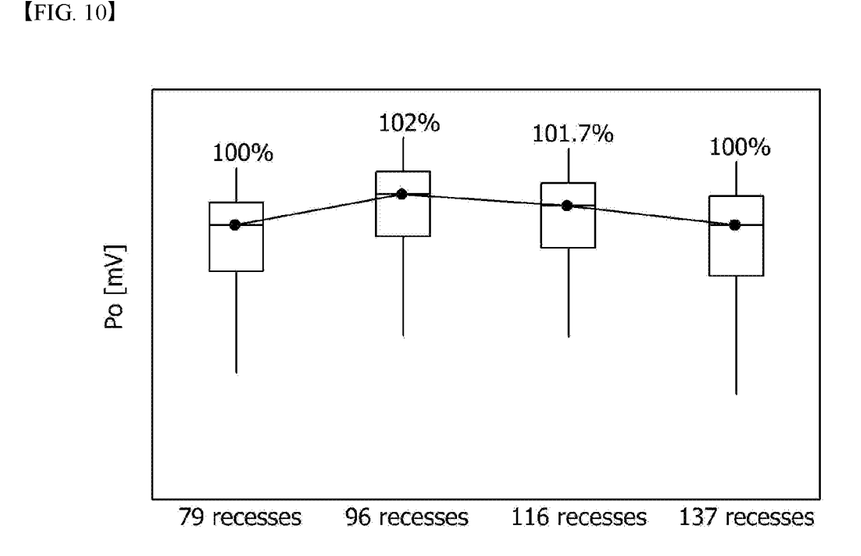
FIG. 10 is a graph measuring optical output of the semiconductor devices according to the first to fourth embodiments.

Referring to FIG. 10, it can be seen that the optical output increases when the number of recesses 128 increases to 96 with respect to a case in which the optical output is 100% when the number of recesses 128 is 79. However, when the number of recesses 128 increases to 137, it can be seen that the optical output is rather deteriorated. This is because, it is determined that the number of recesses 128 increases and thus the light emitting area relatively decreases.

Figure 11:
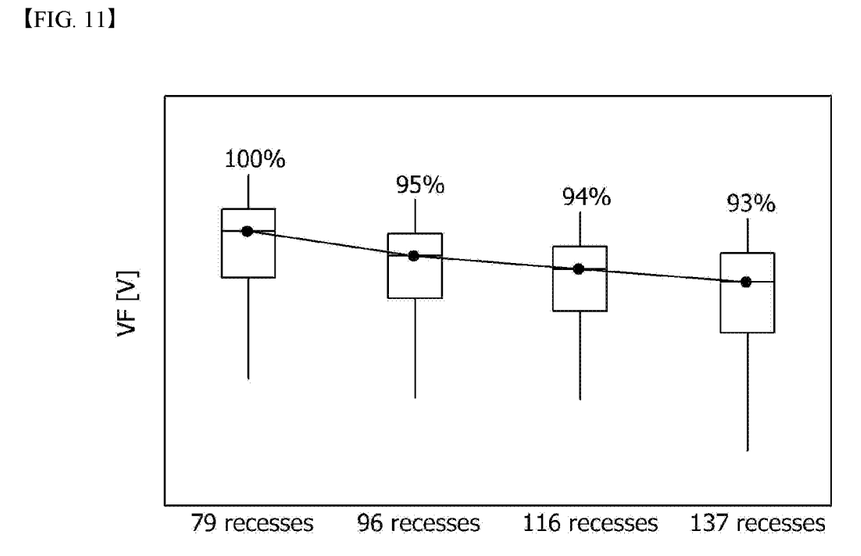
FIG. 11 is a graph measuring operating voltages of the semiconductor devices according to the first to fourth embodiments.

Referring to FIG. 11, it can be seen that the operating voltage decreases when the number of recesses 128 increases to 96 with respect to a case in which the operating voltage is 100% when the number of recesses 128 is 79. Further, even when the number of recesses 128 increases to 116 and 137, it can be seen that the operating voltage slightly decreases. This is because, it is determined that the number of recesses 128 increases and thus the current dispersion efficiency is improved.

Taken together, it can be seen that the optical output may be enhanced and the operating voltage may be lowered when the recesses are manufactured so that the number of recesses is greater than 79 and smaller than 137.

Figure 12:
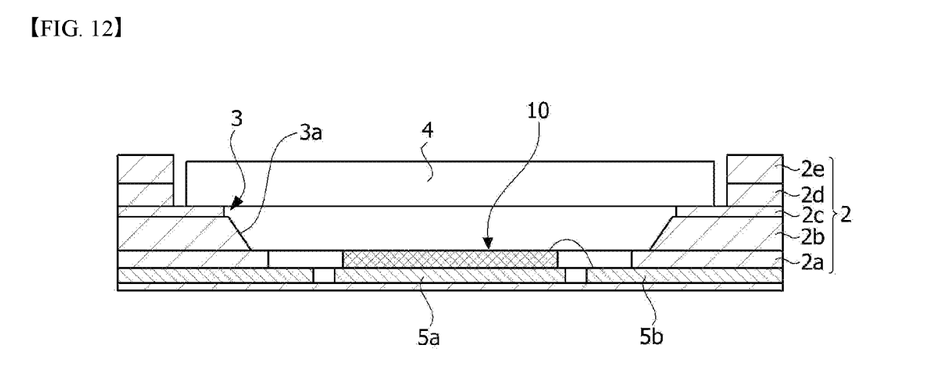
FIG. 12 is a conceptual diagram of a semiconductor device package according to one embodiment of the present invention.
Figure 13:
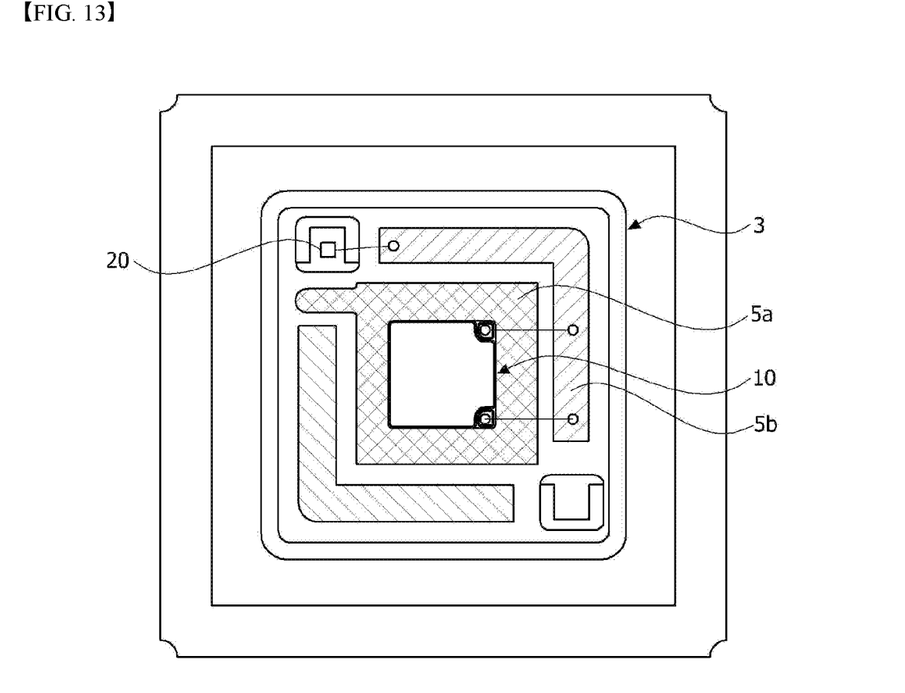
FIG. 13 is a plan view of the semiconductor device package according to one embodiment of the present invention.

FIG. 12 is a conceptual diagram of a light emitting device package according to one embodiment of the present invention, and FIG. 13 is a plan view of the light emitting device package according to one embodiment of the present invention.

Referring to FIGS. 12 and 13, the semiconductor device package may include a body 2 having a groove 3 formed therein, a light emitting device 10 disposed in the body 2, and a pair of lead frames 5a and 5b disposed in the body 2 and electrically connected to the light emitting device 10. The light emitting device 10 may include all of the above-described configurations.

The body 2 may include a material or a coating layer which reflects ultraviolet light. The body 2 may be formed by stacking a plurality of layers 2a, 2b, 2c, 2d, and 2e. The plurality of layers 2a, 2b, 2c, 2d, and 2e may be the same material or may include different materials.

The groove 3 may be formed to be wider as a distance from the light emitting device 10 increases, and a step 3a may be formed on an inclined surface.

The light emitting device 10 may be disposed on a first lead frame 5a and may be connected to a second lead frame 5b by wires. In this case, the first lead frame 5a and the second lead frame 5b may be disposed to surround a side surface of the light emitting device 10.

A light transmission layer 4 may cover the groove 3. The light transmission layer 4 may be formed of a glass material, but is not limited thereto. The light transmission layer 4 is not particularly limited as long as it is a material capable of effectively transmitting ultraviolet light. The inside of the groove 3 may be an empty space.

The semiconductor device may be applied to various types of light source devices. For example, the light source device may be a concept including a sterilization device, a curing device, a lighting device, a display device, a vehicle lamp, and the like. That is, the semiconductor device may be applied to various electronic devices disposed in a case to provide light.

The sterilization device may sterilize a desired area by including the semiconductor device according to the embodiment. The sterilization device may be applied to household appliances such as a water purifier, an air conditioner, a refrigerator, and the like, but is not limited thereto. That is, the sterilization device may be applied to all products (for example, a medical device) which require sterilization.

For example, the water purifier may be provided with the sterilization device according to the embodiment to sterilize circulating water. The sterilization device is disposed in a nozzle or an outlet through which the water circulates to irradiate ultraviolet rays. In this case, the sterilization device may include a waterproof structure.

The curing device may cure various types of liquid by including the semiconductor device according to the embodiment. The liquid may be a concept including all various materials which are cured when irradiated with ultraviolet rays. For example, the curing device may cure various types of resins. Alternatively, the curing device may be applied to cure cosmetic products such as a manicure.

The lighting device may include a light source module including a substrate and the semiconductor device of the embodiment, a heat dissipation part which dissipates heat from the light source module, and a power supply part which processes or converts an electrical signal provided from the outside to provide the electrical signal to the light source module. Further, the lighting device may include a lamp, a head lamp, a street light, or the like.

The display device may include a bottom cover, a reflective plate, a light emitting module, a light guide plate, an optical sheet, a display panel, an image signal output circuit, and a color filter. The bottom cover, the reflection plate, the light emitting module, the light guide plate, and the optical sheet may constitute a backlight unit.

The reflective plate may be disposed on the bottom cover, and the light emitting module may emit light. The light guide plate is disposed in front of the reflection plate to guide the light emitted from the light emitting module to the front, and the optical sheet may include a prism sheet and the like, and may be disposed in front of the light guide plate. The display panel may be disposed in front of the optical sheet, the image signal output circuit may supply an image signal to the display panel, and the color filter may be disposed in front of the display panel.

The semiconductor device may be used as an edge type backlight unit or a direct type backlight unit when used as the backlight unit of the display device.

The semiconductor device may be a laser diode in addition to the above-described light emitting diode.

Like the light emitting device, the laser diode may include a first conductive semiconductor layer, an active layer, and a second conductive semiconductor layer having the above-described structure. Further, an electro-luminescence (electroluminescence) phenomenon in which light is emitted when the current flows after bonding a p-type first conductive semiconductor and an n-type second conductive semiconductor is used, but there are differences in the directivity and phase of the emitted light. That is, in the laser diode, light having one specific wavelength (a monochromatic beam) can be emitted in the same phase and in the same direction using a phenomenon called stimulated emission, constructive interference, and the like, and may be used for optical communication, medical equipment, semiconductor processing equipment, and the like due to these characteristics.

As an example of a light receiving device, a photodetector, which is one type of transducer which detects light and converts intensity thereof into an electric signal, is exemplified. Such a photodetector includes a photocell (silicon or selenium), a photoconductive device (cadmium sulfide or cadmium selenide), a photodiode (for example, a photodiode with a peak wavelength in a visible blind spectral region or a true blind spectral region), a phototransistor, a photomultiplier tube, a photoelectric tube (vacuum or gas filling), an infra-red (IR) detectors or the like, but the embodiment is not limited thereto.

Further, a semiconductor device such as the photodetector may be generally manufactured using a direct bandgap semiconductor having excellent light conversion efficiency. Alternatively, the photodetector has various structures, and the most common structures include a pin-type photodetector using a p-n junction, a Schottky photodetector using a Schottky junction, a metal semiconductor metal (MSM)-type photodetector, and the like.

The photodiode may include a first conductive semiconductor layer, an active layer, and a second conductive semiconductor layer having the above-described structure, like the light emitting device, and is formed to have a p-n junction or a pin structure. The photodiode operates by applying a reverse bias or a zero bias, and when light is incident on the photodiode, electrons and holes are generated and the current flows. In this case, the magnitude of the current may be substantially proportional to the intensity of light incident on the photodiode.

The photocell or the solar cell is a type of photodiode and may convert light into an electric current. The solar cell may include a first conductive semiconductor layer, an active layer, and a second conductive semiconductor layer having the above-described structure like the light emitting device.

Further, the photocell or the solar cell may be used as a rectifier of an electronic circuit through rectification characteristics of a general diode using a p-n junction, and may be applied to an ultra-high frequency circuit to be applied to an oscillation circuit and the like.

In addition, the above-described semiconductor device is not necessarily implemented with only a semiconductor, and may further include a metallic material in some cases. For example, the semiconductor device such as the light receiving device may be implemented using at least one of Ag, Al, Au, In, Ga, N, Zn, Se, P, or As, and may be implemented using a semiconductor material or an intrinsic semiconductor material doped with a p-type dopant or an n-type dopant.

Although the above-described embodiments are mainly described with reference to the embodiments of the present invention, the above are only exemplary, and it should be understood that those skilled in the art may variously perform modifications and applications within the principle of the embodiments. For example, elements specifically shown in the embodiments may be modified. Further, differences related to modifications and changes should be understood as being included in the scope of the present invention defined in the appended claims.

The invention claimed is:

1. A semiconductor device comprising:
    a semiconductor structure including a first conductive semiconductor layer, a second conductive semiconductor layer, an active layer disposed between the first conductive semiconductor layer and the second conductive semiconductor layer, and a plurality of recesses disposed up to a partial region of the first conductive semiconductor layer through the second conductive semiconductor layer and the active layer;
    a plurality of first electrodes disposed in the plurality of recesses and electrically connected to the first conductive semiconductor layer;
    a second electrode electrically connected to the second conductive semiconductor layer;
    a first conductive layer electrically connected to the plurality of first electrodes;

a second conductive layer electrically connected to the second electrode;

an electrode pad electrically connected to the second conductive layer;

a first insulating layer disposed in the recess to insulate the first conductive layer from the active layer and the second conductive semiconductor layer; and a second insulating layer disposed between the first conductive layer and the second conductive layer, wherein the electrode pad includes a first electrode pad and a second electrode pad which are spaced apart from each other, wherein an area ratio of the electrode pad and the second conductive layer ranges from 1:20 to 1:27, wherein the second conductive layer directly contacts the electrode pad, an end of the second conductive layer close to the electrode pad is disposed to be spaced apart from a side surface of the semiconductor device and the end of the second conductive layer is covered by the second insulating layer, and wherein the second conductive layer contacts side surfaces and an upper surface of the first insulating layer and completely surrounds the second electrode.

2. The semiconductor device of claim 1, wherein an area ratio of the electrode pad and the plurality of first electrodes ranges from 1:1.2 to 1:2.1.

3. The semiconductor device of claim 1, wherein an area ratio of the plurality of first electrodes and the semiconductor structure ranges from 1:9 to 1:12.

4. The semiconductor device of claim 1, wherein an area ratio of the second electrode and the semiconductor structure ranges from 1:1.1 to 1:2.

5. The semiconductor device of claim 1, further comprising a conductive substrate disposed under the second conductive layer and a bonding layer disposed between the second conductive layer and the conductive substrate.

6. The semiconductor device of claim 5, wherein an area ratio of the conductive substrate and the semiconductor structure ranges from 1:0.3 to 1:0.6.

7. The semiconductor device of claim 5, wherein an area ratio of the conductive substrate and the electrode pad ranges from 1:0.015 to 1:0.04.

8. The semiconductor device of claim 1, wherein a diameter of the recess ranges from 25 µm to 55 µm.

9. The semiconductor device of claim 8, wherein the number of the plurality of recesses is greater than 79 and smaller than 137.

10. The semiconductor device of claim 1, wherein an average of the number of the plurality of recesses ranges from 8 to 13 per 100 µm$^2$.

11. The semiconductor device of claim 1, wherein the semiconductor structure further includes a trench disposed along a side surface of the semiconductor structure and surrounding the plurality of recesses.

12. The semiconductor device of claim 11, wherein the trench continuously extends along an outer side surface of the semiconductor structure.

13. The semiconductor device of claim 12, wherein an area ratio of the semiconductor structure and the trench ranges from 1:0.01 to 1:0.03.

14. The semiconductor device of claim 1, wherein an area ratio of the semiconductor structure and the electrode pad ranges from 1:0.02 to 1:0.06.

15. The semiconductor device of claim 1, wherein the active layer generates light in an ultraviolet wavelength range.

16. The semiconductor device of claim 1, wherein an end of the second conductive layer is disposed to be spaced apart from a side surface of the semiconductor device and is covered by the second insulating layer.

17. The semiconductor device of claim 1, wherein the first conductive semiconductor layer, the second conductive semiconductor layer, and the active layer include aluminum.

18. The semiconductor device of claim 17, wherein aluminum compositions of the first conductive semiconductor layer and the second conductive semiconductor layer are different.

19. The semiconductor device of claim 1, wherein the first electrode and the second electrode include ohmic electrodes.

* * * * *